(12) United States Patent
Dai

(10) Patent No.: US 6,861,301 B2
(45) Date of Patent: Mar. 1, 2005

(54) METHOD OF FORMING A THIN FILM TRANSISTOR ON A TRANSPARENT PLATE

(75) Inventor: Yuan-Tung Dai, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/793,916

(22) Filed: Mar. 8, 2004

(65) Prior Publication Data
US 2004/0171199 A1 Sep. 2, 2004

Related U.S. Application Data

(62) Division of application No. 10/152,671, filed on May 23, 2002, now Pat. No. 6,764,887.

(30) Foreign Application Priority Data

Feb. 18, 2002 (TW) ........................................ 91102658 A

(51) Int. Cl.$^7$ .............................................. H01L 21/84
(52) U.S. Cl. ...................... 438/162; 438/166
(58) Field of Search ................. 438/151, 162, 438/166, 528, 530

(56) References Cited

U.S. PATENT DOCUMENTS

| | | | | |
|---|---|---|---|---|
| 5,930,609 A | * | 7/1999 | Young | 438/166 |
| 5,946,585 A | * | 8/1999 | Zhang et al. | 438/475 |
| 6,025,607 A | * | 2/2000 | Ohori et al. | 257/72 |
| 6,569,718 B2 | * | 5/2003 | McCulloch et al. | 438/149 |

\* cited by examiner

Primary Examiner—Chandra Chaudhari
(74) Attorney, Agent, or Firm—Birch, Stewart, Kolasch & Birch, LLP

(57) ABSTRACT

A method of forming a thin film transistor on a transparent plate. A silicon layer having an active area is provided. A first ion implantation is performed to form a deeper doped region in the silicon layer. A second ion implantation is performed to form a shallower doped region in part of the silicon layer. A transistor structure is formed on the silicon layer located at the active area. A glass plate is formed on the transistor structures. An annealing process whose temperature is about 200° C.~600° C. is performed to peel the silicon layer from the deeper doped region and the shallower doped region, and to form a silicon thin film adhered to the transistor structure. Thus, the silicon thin film transistor can be formed on the glass plate without a high temperature process.

25 Claims, 10 Drawing Sheets

METHOD OF FORMING A THIN FILM TRANSISTOR ON A TRANSPARENT PLATE

This application is a Divisional of co-pending application Ser. No. 10/152,671, filed on May 23, 2002, now U.S. Pat. No. 6,764,887, the entire contents of which are hereby incorporated by reference and for which priority is claimed under 35 U.S.C. § 120; and this application claims priority of Application No. 091102658 filed in Taiwan, R.O.C. on Feb. 18, 2002 under 35 U.S.C. § 119.

BACKGROUND OF THE INVENTION

1. Field of the Invention

The present invention relates to a liquid crystal display process, and more particularly, to a method of forming a thin film transistor on a transparent plate.

2. Description of the Related Art

Active matrix LCDs (Liquid Crystal Displays) have been developed for mass production. The active matrix LCDs are highly integrated circuits whose level of integration is enhanced by using a technique of producing a semiconductor film on a substrate. The active matrix LCDs enable display of animation with high resolution. Such high resolution animation is obtained with a TFT (Thin Film Transistor), which is a switching element of a matrix display portion, disposed on one of two substrates with a liquid crystal interposed between them.

In the typical manufacturing process for forming a high resolution LCD, the HTPS (high temperature polysilicon) having a high mobility of about 30 to 150 $cm^2/V \cdot sec$ is used for the material of a channel layer in the TFT. When the polysilicon is used, the TFT is formed to have sufficient speed to be utilized as a driver in the LCD.

However, the polysilicon film is typically formed by a SPC (Solid Phase Crystallization) method that applies heat to an amorphous-silicon film formed on the substrate to induce crystallization or by a low pressure CVD method that directly deposits the polysilicon on the substrate. These film making methods are carried out at a high temperature of 700° C. to 900° C., so the polysilicon TFT LCD production process is called a high temperature process. In the high temperature process, an expensive substrate such as a heat-resistant quartz plate or the like is required, which leads to a high cost. Additionally, the size of the quartz plate has a limitation, which hinders the LCD from achieving large scale.

SUMMARY OF THE INVENTION

An object of the present invention is to provide a method of forming a thin film transistor on a transparent plate.

Another object of the present invention is to provide a method of forming a silicon thin film transistor on a glass plate without a high temperature process.

To achieve these objects, the present invention provides a method of forming a thin film transistor on a transparent plate. A semiconductor layer having an active area is provided. A first ion implantation is performed to form a deeper doped region in the semiconductor layer. A second ion implantation is performed to form a shallower doped region in part of the semiconductor layer. A transistor structure is formed on the semiconductor layer located at the active area. A glass plate is formed on the transistor structure. An annealing process whose temperature is about 200° C.~600° C. is performed to peel the silicon layer from the deeper doped region and the shallower doped region, and to form a semiconductor thin film adhered to the transistor structure.

The present invention improves on the prior art in that the silicon layer is peeled from the deeper doped region and the shallower doped region to form the TFT on the glass plate with the annealing process whose temperature is about 200° C.~600° C. Thus, the invention can use the cheaper glass plate and use single crystal silicon having a higher mobility (about 500 $cm^2/V \cdot sec$) than polysilicon as the channel layer in the TFT, thereby reducing cost, raising performance, and ameliorating the disadvantages of the prior art.

BRIEF DESCRIPTION OF THE DRAWINGS

The present invention can be more fully understood by reading the subsequent detailed description in conjunction with the examples and references made of the accompanying drawings, wherein.

DETAILED DESCRIPTION OF THE INVENTION

The First Embodiment

A method of forming a thin film transistor on a transparent plate embodiment is shown with reference to FIGS. 1~10. FIGS. 1~10 are sectional views of the method of forming a thin film transistor on a transparent plate according to the first embodiment of the present invention.

Figure 1:
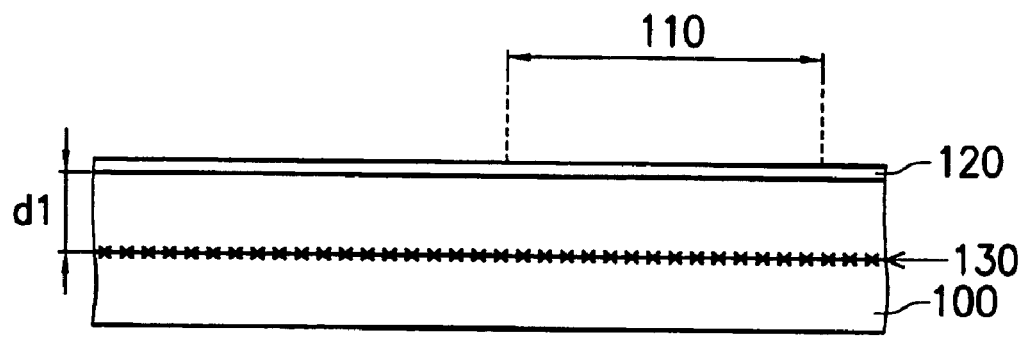
FIGS. 1~10 are sectional views of the method of forming a thin film transistor on a transparent plate according to the first embodiment of the present invention.

In FIG. 1, a semiconductor layer 100 having an active area 110 is provided. The semiconductor layer 100 may be made of silicon, and the thickness of the semiconductor layer 100 is about 550 $\mu$m. For example, the semiconductor layer 100 can be a polysilicon or a single crystal silicon wafer. The single crystal silicon wafer is preferred since single crystal silicon has a high mobility of about 500 $cm^2/V \cdot sec$. Then, a gate insulation layer 120 is formed on the semiconductor layer 100. The gate insulation layer 120 may be a $SiO_2$ layer formed by thermal oxidation or CVD.

In FIG. 1, a first ion implantation is performed to form a deeper doped region 130 in the semiconductor layer 100. The depth d1 of the deeper region 130 is about 1000~12000 angstrom. The first ion implantation can be a hydrogen ion implantation or a nitrogen ion implantation. The operation of the first ion implantation may be under the conditions of 50~300 keV, $10^{-2}$~$10^{-10}$ torr to implant hydrogen ion or nitrogen ion whose dosage concentration is $10^{13}$~$10^{17}$ atom/$cm^2$.

Figure 2:
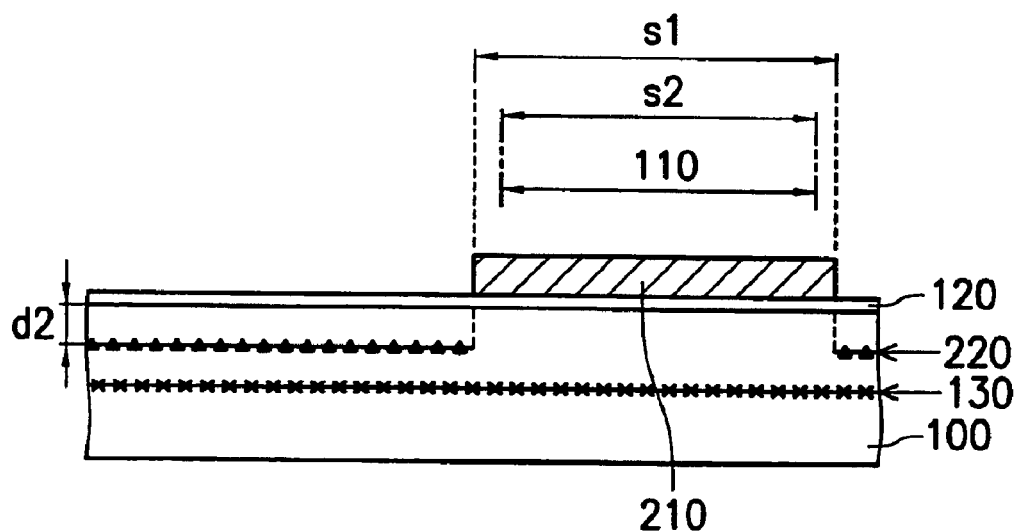

In FIG. 2, a shielding layer 210 is formed on part of the gate insulation layer 120, wherein the width s1 of the shielding layer 120 is greater than the width s2 of the active area 110. The shielding layer 120 may be a photoresist layer, a metal layer or a SiN layer.

In FIG. 2, using the shielding layer 120 as a mask, a second ion implantation is performed to form a shallower doped region 220 in part of the semiconductor layer 100. The depth d2 of the shallower region 220 is about 500~2000 angstrom. The second ion implantation can be a hydrogen ion implantation or a nitrogen ion implantation. The operation of the second ion implantation may be under the conditions of 10~250 keV, $10^{-2}$~$10^{-10}$ torr to implant hydrogen ion or nitrogen ion whose dosage concentration is $10^{13}$~$10^{17}$ atom/$cm^2$. Then, the shielding layer 210 is removed.

Figure 3:
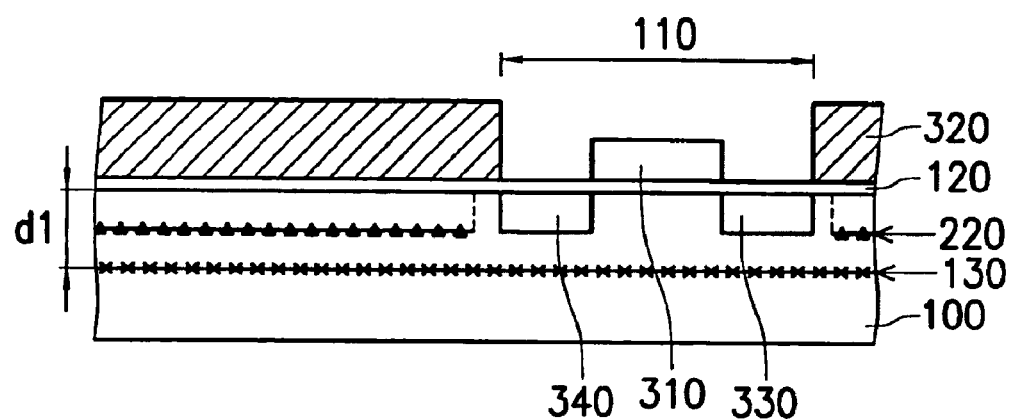

In FIG. 3, a gate layer 310 is formed on part of the gate insulation layer 120. The gate layer 310 can be a polysilicon layer or a metal layer formed by deposition.

In FIG. 3, a source region 330 and a drain region 340 are formed in the semiconductor layer 100 located at both sides of the gate layer 310. For example, an n+ or p+ silicon pattern 320 is formed on part of the gate insulation layer 120 exposing the gate insulation layer 120 located at the active area 110. Using the pattern 320 and the gate layer 310 as a mask, a third ion implantation is performed to form the source region 330 and the drain region 340 in the semiconductor layer 100. The ion type of the third ion implantation is n type or p type. Then, the pattern 320 is removed. Moreover, it is preferred that the depth of the source/drain region 330, 340 is not greater than the depth d1 of the deeper region 130. Furthermore, it is possible to form an LDD (lightly doped drain) structure in the source/drain region 330, 340. In order to simplify the illustration, the conventional LDD structure is not shown in FIGS. 1~10, but this is not to limit the present invention.

Figure 4:
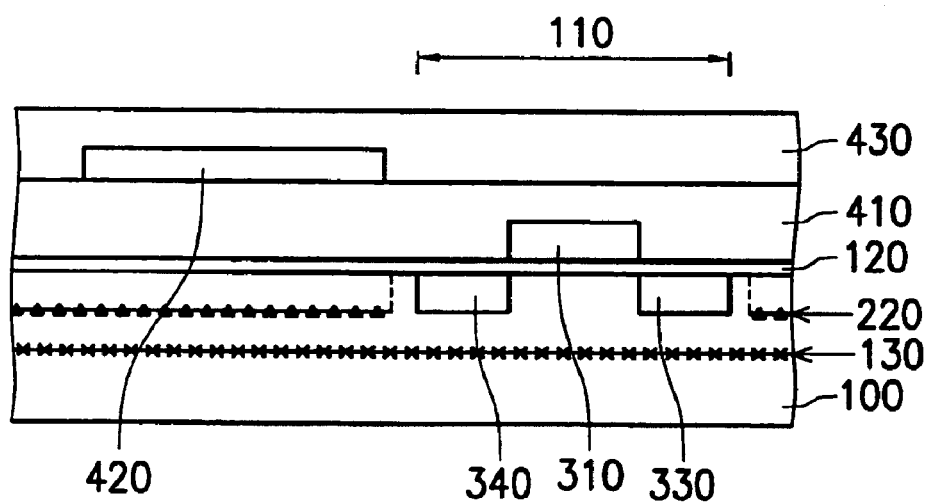

In FIG. 4, a first insulation layer 410 is formed on the gate layer 310 and the gate insulation layer 120, wherein the first insulation layer 410 may be a SiO$_2$ layer formed by CVD.

In FIG. 4, a first conductive layer 420 is formed on part of the first insulation layer 410. The first conductive layer 420 may be an ITO (indium tin oxide) layer or an IZO (indium zinc oxide) layer formed by deposition. The first conductive layer 420 serves as a pixel electrode.

In FIG. 4, a second insulation layer 430 is formed on the first conductive layer 420 and the first insulation layer 410. The second insulation layer 430 may be a SiO$_2$ layer formed by CVD.

Figure 5:
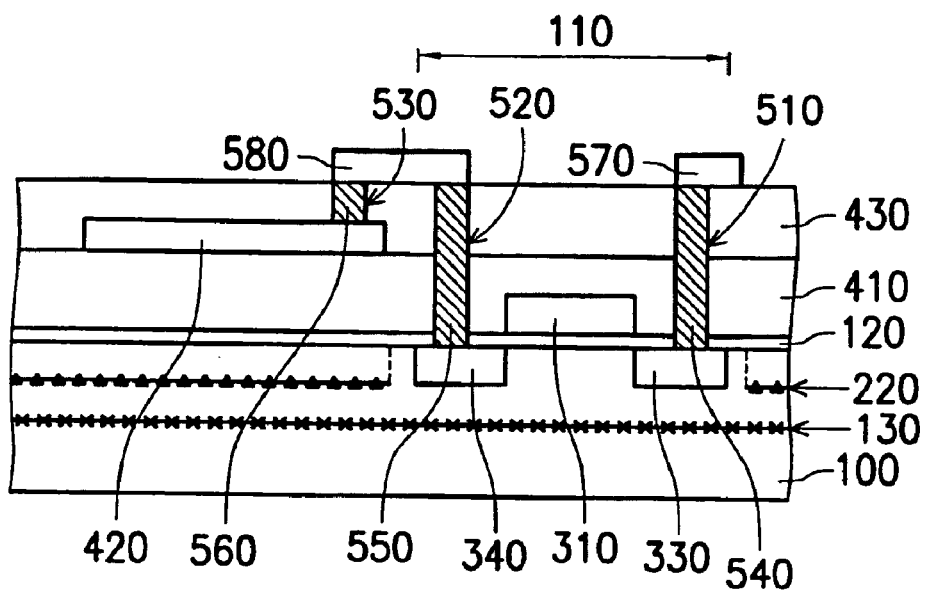

In FIG. 5, part of the second insulation layer 430, the first insulation layer 410 and the gate insulation layer 120 are removed to form a first opening hole 510, a second opening hole 520 and a third opening hole 530. The first opening hole 510 exposes part of the surface of the source region 330, the second opening hole 520 exposes part of the surface of the drain region 340 and the third opening hole 530 exposes part of the surface of the first conductive layer 420. Then, a conductive material, such as tungsten (W), titanium (Ti) or aluminum (Al), is filled in the first opening hole 510, the second opening hole 520 and the third opening hole 530 to form a first plug 540, a second plug 550 and a third plug 560.

In FIG. 5, a second conductive layer 570 and a third conductive layer 580 are formed on part of the second insulation layer 430. The second conductive layer 570 electrically connects the first plug 540. The third conductive layer 580 electrically connects the second plug 550 and the third plug 560. The second conductive layer 570 and the third conductive layer 580 may be molybdenum (Mo), tungsten (W), aluminum (Al) or aluminum alloy.

Figure 6:
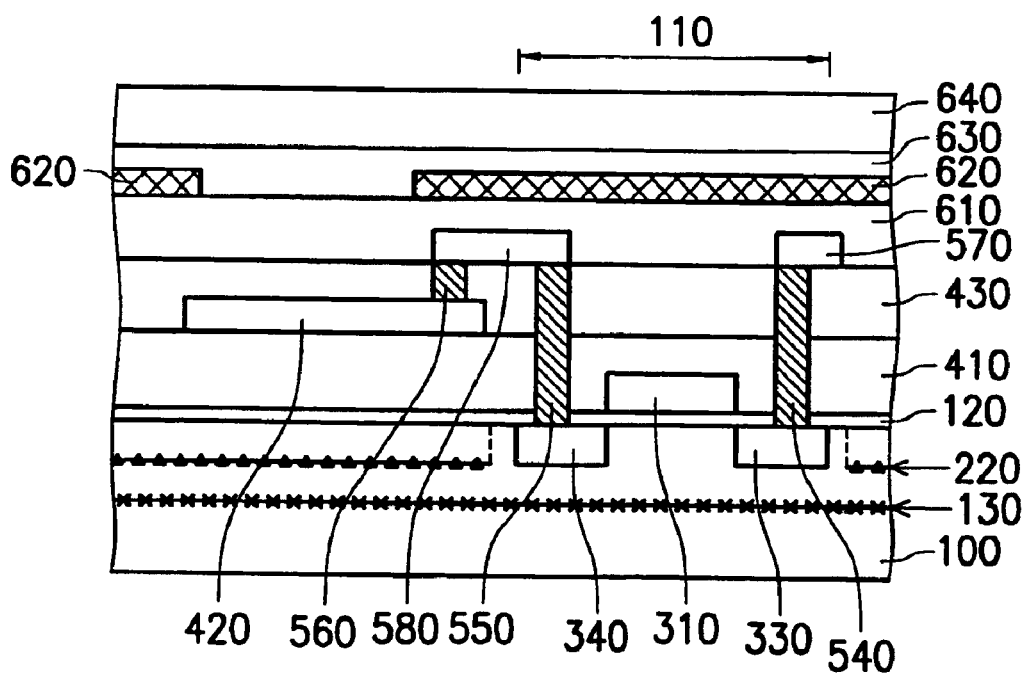

In FIG. 6, a third insulation layer 610 is formed on the second conductive layer 570, the third conductive layer 580 and the second insulation layer 430. The third insulation layer 610 may be a SiO$_2$ layer formed by deposition.

In FIG. 6, a shade pattern 620 is formed on part of the third insulation layer 610, wherein the shade pattern 620 is not over the first conductive layer 420 or is over part of the first conductive layer 420. The shade pattern 620 is black and opaque, which is called a black matrix. The shade pattern 620 may be a chromium (Cr) layer.

In FIG. 6, a silicon oxide layer 630 is formed on the shade pattern 620 and the third insulation layer 610. Further, the surface of the silicon oxide layer 630 can be smoothed by planarization.

In FIG. 6, a transparent plate 640 is formed on the silicon oxide layer 630. For example, an anode bonding process is performed to connect the transparent plate 640 to the silicon oxide layer 630. The transparent plate 640 may be made of glass, quartz or plastic.

Figure 7:
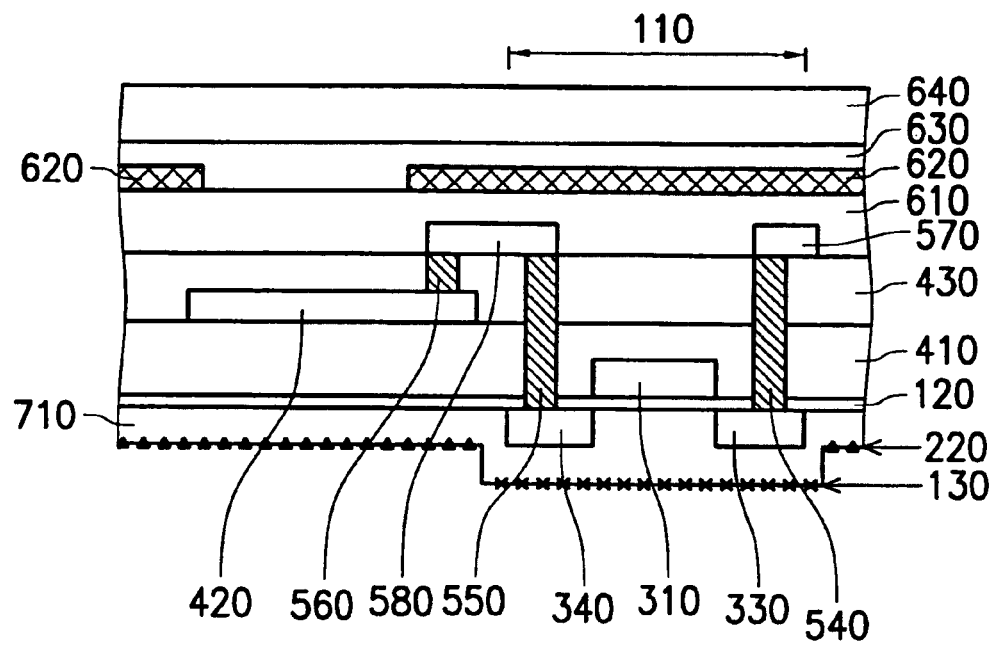

In FIG. 7, an annealing process whose temperature is about 200~600° C. is performed to make the semiconductor layer 100 peeled from the deeper doped region 130 and the shallower doped region 220, to form a semiconductor thin film 710 adhered to the gate insulation layer 120. That is, by the annealing process, the hydrogen ion or the nitrogen ion in the region 130, 220 can be bonded together to become gas molecules and burst. This technology is called smart cut. Additionally, the annealing process also serves as a heat treatment for the source region 330 and the drain region 340.

Figure 8:
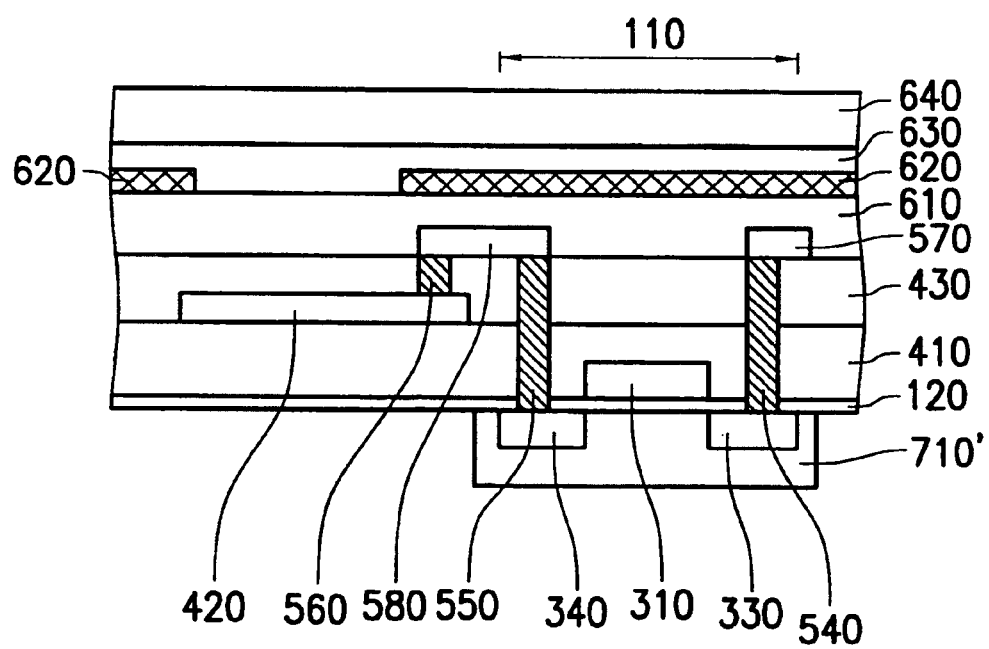
Figure 9:
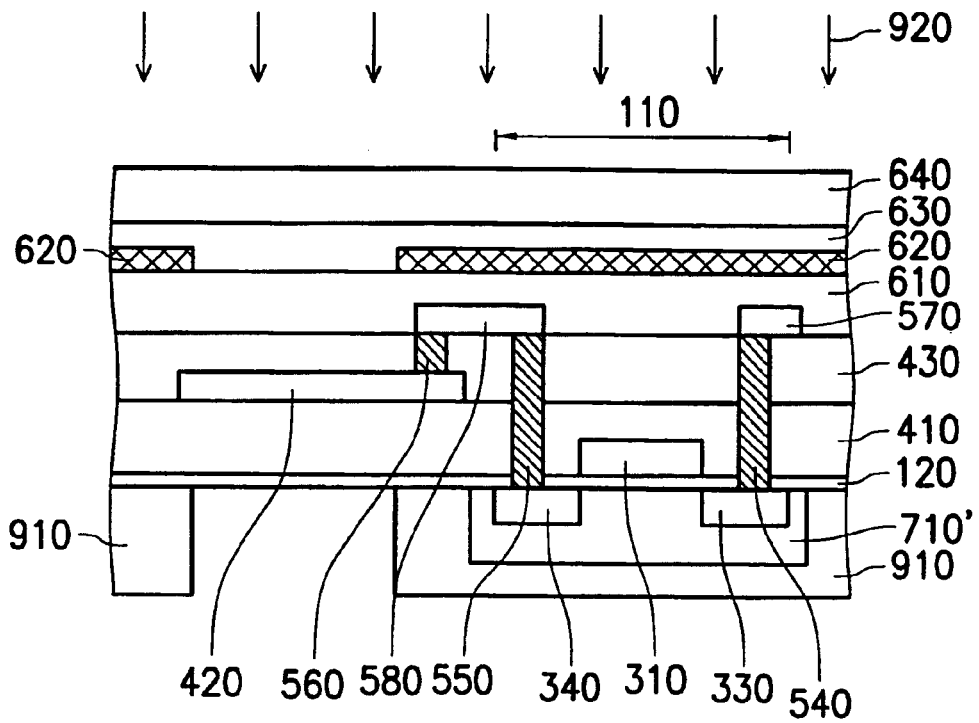

In FIG. 8, part of the semiconductor thin film 710 is removed to expose part of the gate insulation layer 120, and a remaining semiconductor thin film 710' adhered to the gate insulation layer 120 located at the active area 110 is left. Moreover, the surface of the remaining semiconductor thin film 710' can be smoothed by CMP.

Figure 10:
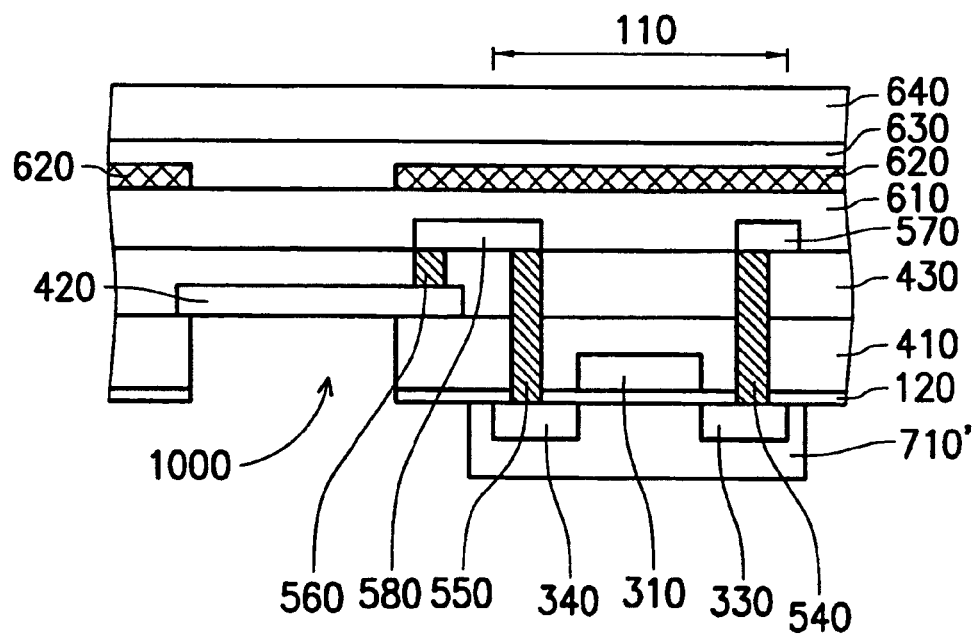

In FIG. 10, part of the gate oxide layer 120 and part of the first insulation layer 410 are removed to form a fourth opening hole 1000, wherein the fourth opening hole 1000 exposes the first conductive layer 420. As a demonstrative method of forming the fourth opening hole 1000, referring to FIG. 9, a photoresist layer (not shown) is formed on the interior side of the gate insulation layer 120. Using the shade pattern 620 as a mask, a backslide exposure process 920 is performed to form a photoresist pattern 910 on part of the interior side of the gate insulation layer 120. Using the photoresist pattern 910 as an etching mask, part of the gate insulation layer 120 and the first insulation layer 410 is removed to form a fourth opening hole 1000 exposing the interior surface of the first conductive layer 420.

The Second Embodiment

Another method of forming a thin film transistor on a transparent plate embodiment is shown with reference to FIGS. 11~20. FIGS. 11~20 are sectional views of the method of forming a thin film transistor on a transparent plate according to the second embodiment of the present invention.

Figure 11:
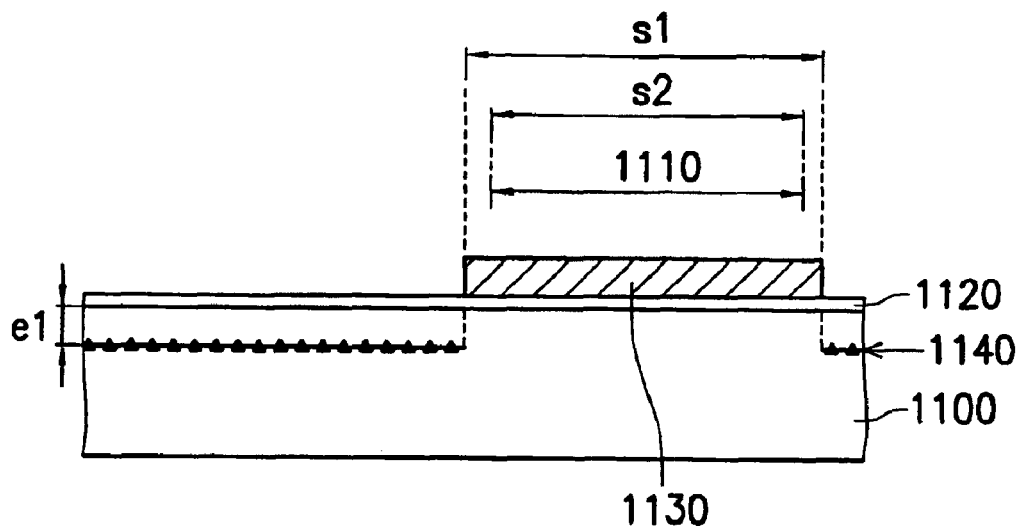
FIGS. 11~20 are sectional views of the method of forming a thin film transistor on a transparent plate according to the second embodiment of the present invention.

In FIG. 11, a semiconductor layer 1100 having an active area 1110 is provided. The semiconductor layer 1100 may be made of silicon, and the thickness of the semiconductor layer 1100 is about 550 $\mu$m. For example, the semiconductor layer 1100 can be a polysilicon or a single crystal silicon wafer. The single crystal silicon wafer is preferred since single crystal silicon has a high mobility of about 500 cm2/V·sec. Then, a gate insulation layer 1120 is formed on the semiconductor layer 1100. The gate insulation layer 1120 may be a SiO$_2$ layer formed by thermal oxidation or CVD.

In FIG. 11, a shielding layer 1130 is formed on part of the gate insulation layer 1120, wherein the width s1 of the shielding layer 1120 is greater than the width s2 of the active area 1110. The shielding layer 1120 may be a photoresist layer, a metal layer or a SiN layer.

In FIG. 11, using the shielding layer 1120 as a mask, a first ion implantation is performed to form a shallower doped region 1140 in the semiconductor layer 1100. The depth e1 of the shallower region 1140 is about 500~2000 angstrom. The first ion implantation can be a hydrogen ion implantation or a nitrogen ion implantation. The operation of the first ion implantation may be under the conditions of 10~250 keV, $10^{-2}$~$10^{-10}$ torr to implant hydrogen ion or nitrogen ion whose dosage concentration is $10^{13} \sim 10^{17}$ atom/cm$^2$. Then, the shielding layer 1130 is removed.

Figure 12:
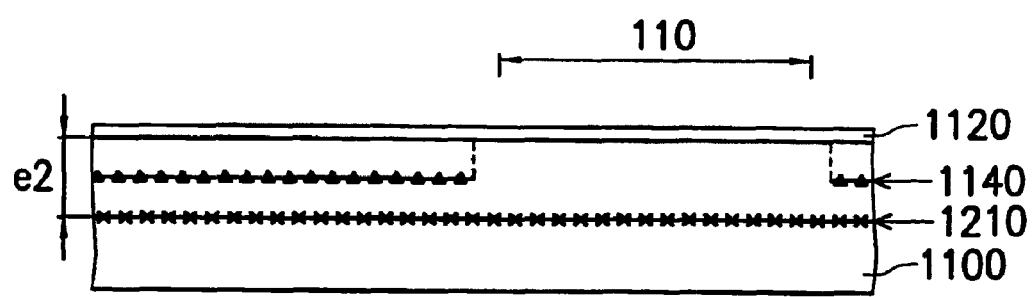

In FIG. 12, a second ion implantation is performed to form a deeper doped region 1210 in part of the semiconductor layer 1100. The depth e2 of the deeper region 1210 is about 1000~12000 angstrom. The second ion implantation can be a hydrogen ion implantation or a nitrogen ion implantation. The operation of the second ion implantation may be under the conditions of 50~300 keV, $10^{-2} \sim 10^{-10}$ torr to implant hydrogen ion or nitrogen ion whose dosage concentration is $10^{13} \sim 10^{17}$ atom/cm$^2$.

Figure 13:
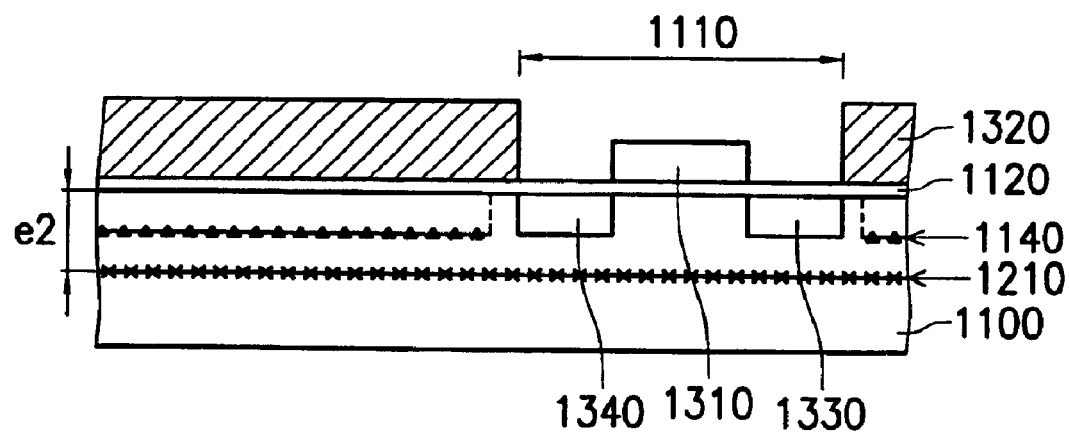

In FIG. 13, a gate layer 1310 is formed on part of the gate insulation layer 1120. The gate layer 1310 can be a polysilicon layer or a metal layer formed by deposition.

In FIG. 13, a source region 1330 and a drain region 1340 are formed in the semiconductor layer 1100 located at both sides of the gate layer 1310. For example, an n$^+$ or p$^+$ silicon pattern 1320 is formed on part of the gate insulation layer 1120 exposing the gate insulation layer 1120 located at the active area 1110. Using the pattern 1320 and the gate layer 1310 as a mask, a third ion implantation is performed to form the source region 1330 and the drain region 1340 in the semiconductor layer 1100. The ion type of the third ion implantation is n type or p type. Then, the pattern 1320 is removed. Moreover, it is preferred that the depth of the source/drain region 1330, 1340 is not greater than the depth e2 of the deeper region 1210. Furthermore, it is possible to form an LDD (lightly doped drain) structure in the source/drain region 1330, 1340. In order to simplify the illustration, the conventional LDD structure is not shown in FIGS. 11~20, but this is not to limit the present invention.

Figure 14:
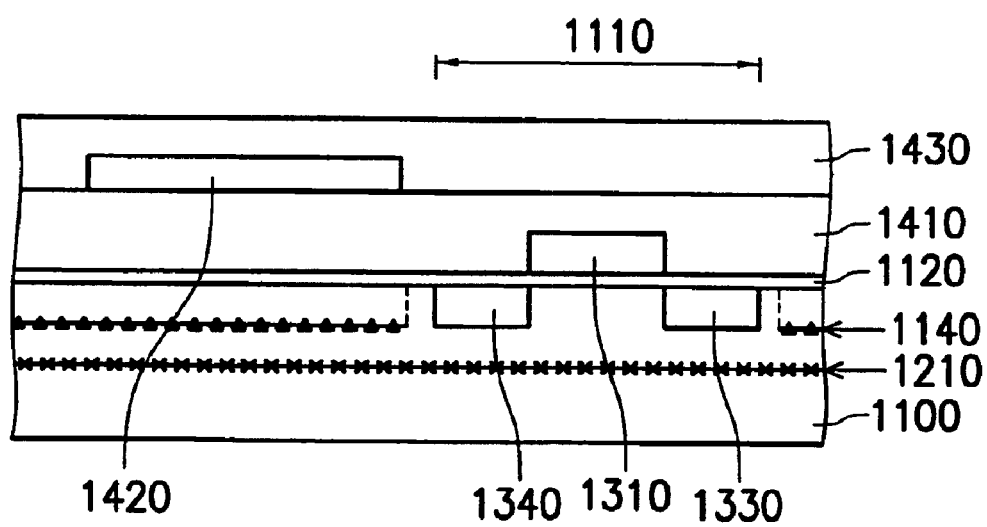

In FIG. 14, a first insulation layer 1410 is formed on the gate layer 1310 and the gate insulation layer 1120, wherein the first insulation layer 1410 may be a SiO$_2$ layer formed by CVD.

In FIG. 14, a first conductive layer 1420 is formed on part of the first insulation layer 1410. The first conductive layer 1420 may be an ITO (indium tin oxide) layer or an IZO (indium zinc oxide) layer formed by deposition. The first conductive layer 1420 serves as a pixel electrode.

In FIG. 14, a second insulation layer 1430 is formed on the first conductive layer 1420 and the first insulation layer 1410. The second insulation layer 1430 may be a SiO$_2$ layer formed by CVD.

Figure 15:
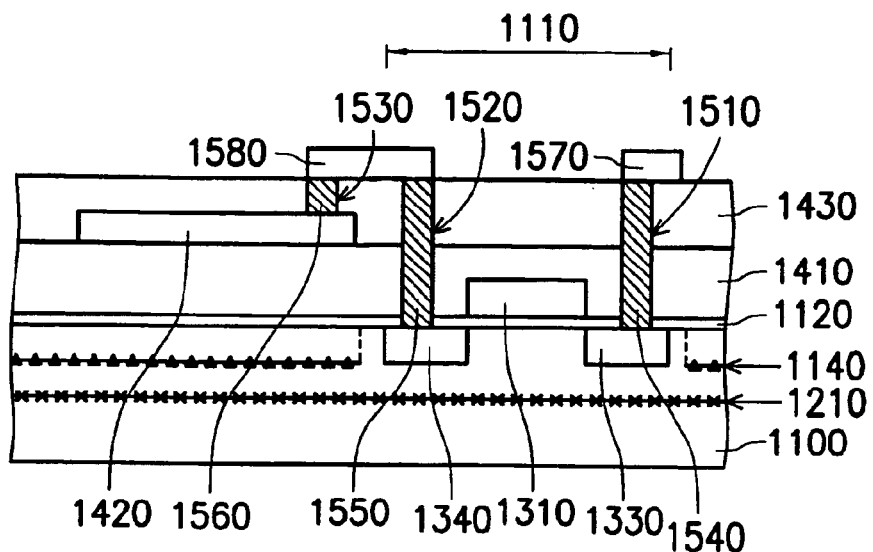

In FIG. 15, part of the second insulation layer 1430, the first insulation layer 1410 and the gate insulation layer 1120 are removed to form a first opening hole 1510, a second opening hole 1520 and a third opening hole 1530. The first opening hole 1510 exposes part of the surface of the source region 1330, the second opening hole 1520 exposes part of the surface of the drain region 1340 and the third opening hole 1530 exposes part of the surface of the first conductive layer 1420. Then, a conductive material, such as tungsten (W), titanium (Ti) or aluminum (Al), is filled in the first opening hole 1510, the second opening hole 1520 and the third opening hole 1530 to form a first plug 1540, a second plug 1550 and a third plug 1560.

In FIG. 15, a second conductive layer 1570 and a third conductive layer 1580 are formed on part of the second insulation layer 1430. The second conductive layer 1570 electrically connects the first plug 1540. The third conductive layer 1580 electrically connects the second plug 1550 and the third plug 1560. The second conductive layer 1570 and the third conductive layer 1580 may be molybdenum (Mo), tungsten (w), aluminum (Al) or aluminum alloy.

Figure 16:
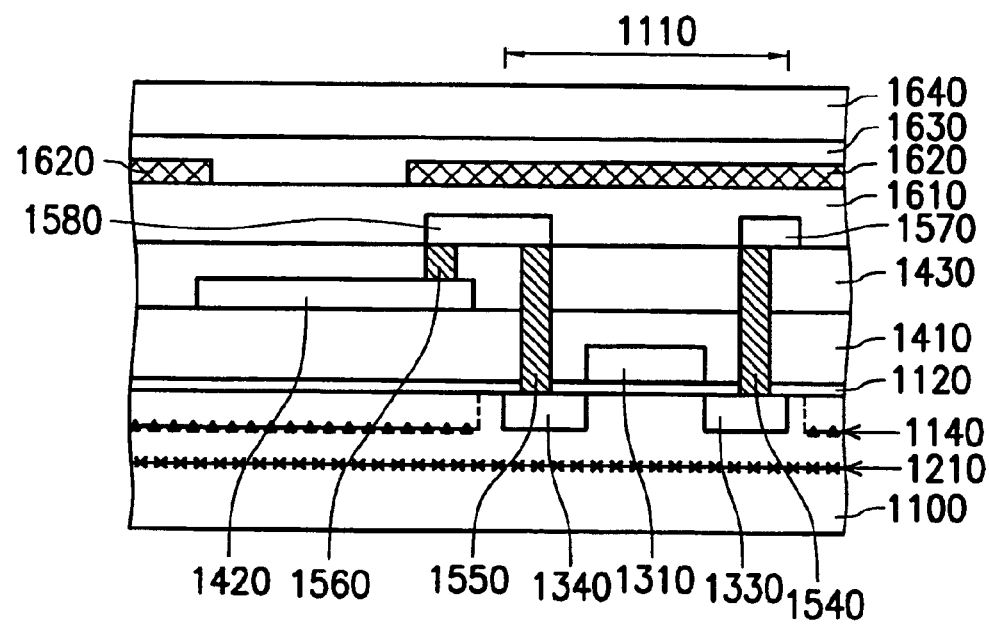

In FIG. 16, a third insulation layer 1610 is formed on the second conductive layer 1570, the third conductive layer 1580 and the second insulation layer 1430. The third insulation layer 1610 may be a SiO$_2$ layer formed by deposition.

In FIG. 16, a shade pattern 1620 is formed on part of the third insulation layer 1610, wherein the shade pattern 1620 is not over the first conductive layer 1420 or is over part of the first conductive layer 1420. The shade pattern 1620 is black and opaque, which is called a black matrix. The shade pattern 1620 may be a chromium (Cr) layer.

In FIG. 16, a silicon oxide layer 1630 is formed on the shade pattern 1620 and the third insulation layer 1610. Further, the surface of the silicon oxide layer 1630 can be smoothed by planarization.

In FIG. 16, a transparent plate 1640 is formed on the silicon oxide layer 1630. For example, an anode bonding process is performed to connect the transparent plate 1640 to the silicon oxide layer 1630. The transparent plate 1640 may be made of glass, quartz or plastic.

Figure 17:
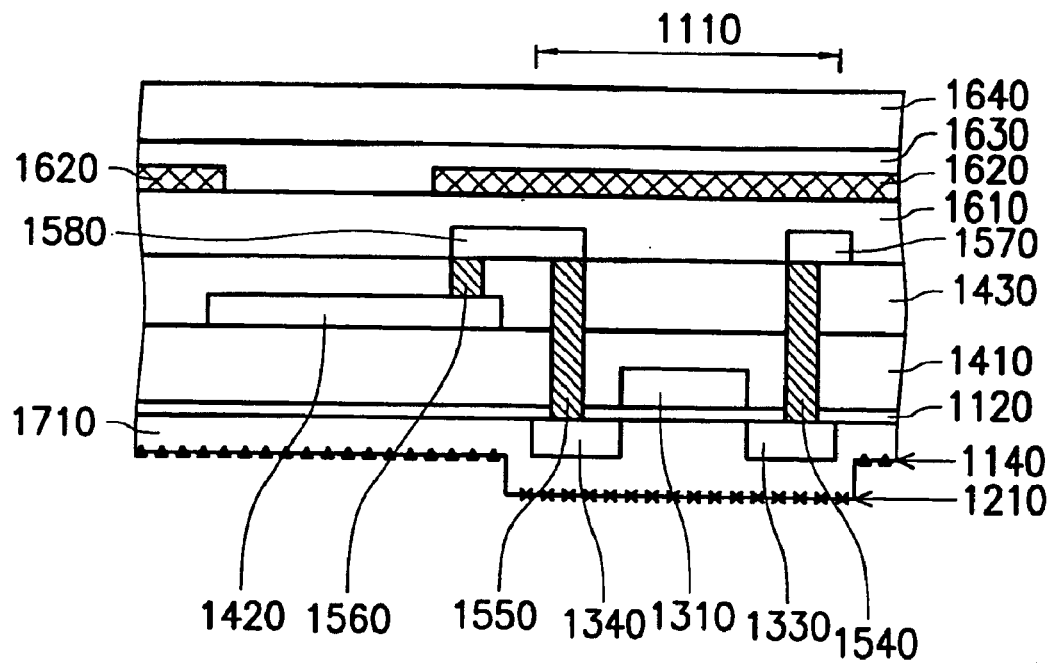

In FIG. 17, an annealing process whose temperature is about 200~600° C. is performed to peel the semiconductor layer 1100 from the deeper doped region 1210 and the shallower doped region 1140, to form a semiconductor thin film 1710 adhered to the gate insulation layer 1120. That is, by the annealing process, the hydrogen ion or the nitrogen ion in the region 1140, 1220 can be bonded together to become gas molecules and burst. This technology is called smart cut. Additionally, the annealing process also serves as a heat treatment for the source region 1330 and the drain region 1340.

Figure 18:
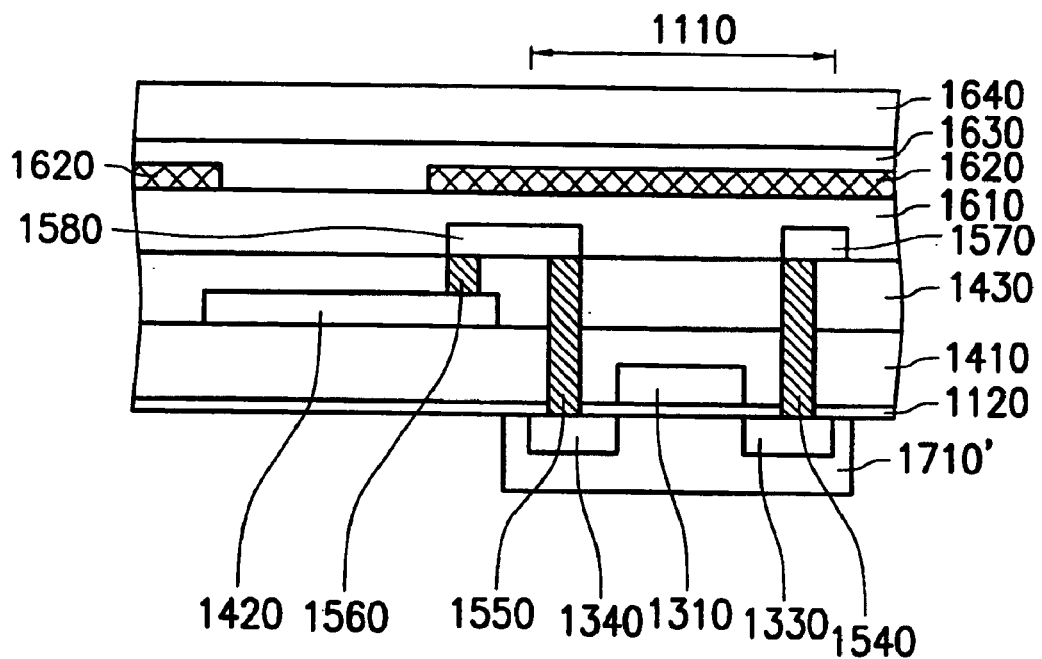
Figure 19:
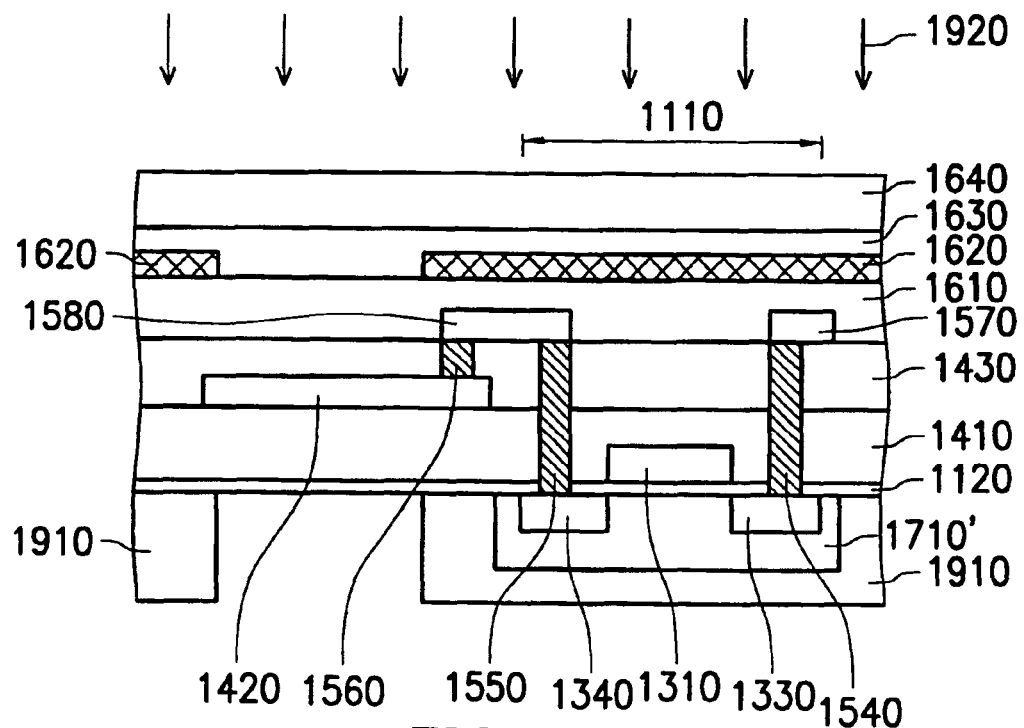

In FIG. 18, part of the semiconductor thin film 1710 is removed to expose part of the gate insulation layer 1120, and a remaining semiconductor thin film 1710' adhered to the gate insulation layer 1120 located at the active area 1110 is left. Moreover, the surface of the remaining semiconductor thin film 1710' can be smoothed by CMP.

Figure 20:
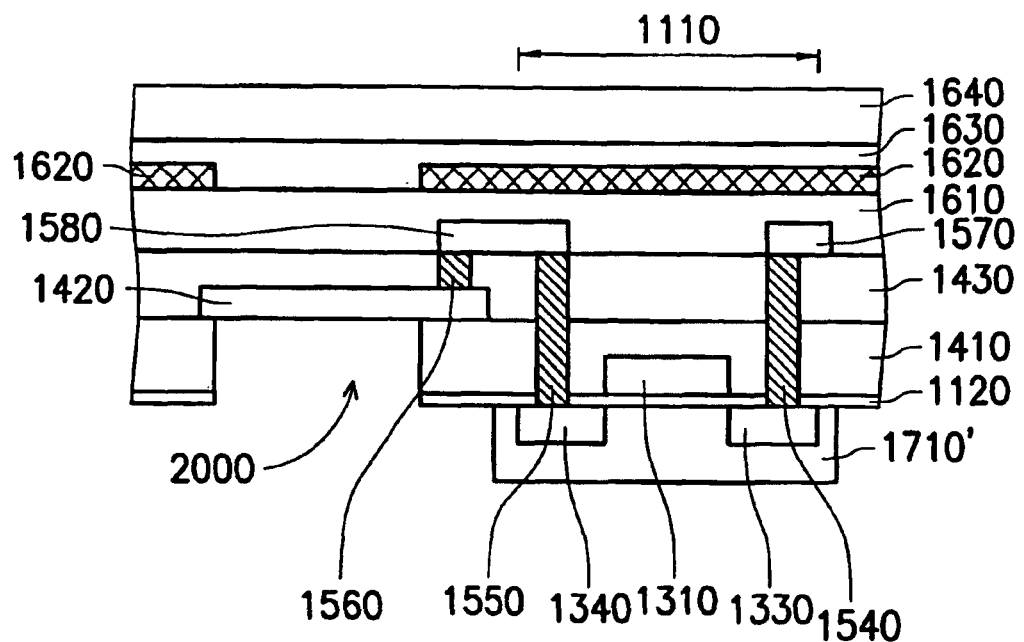

In FIG. 20, part of the gate oxide layer 1120 and part of the first insulation layer 1410 is removed to form a fourth opening hole 2000, wherein the fourth opening hole 2000 exposes the first conductive layer 1420. As a demonstrative method of forming the fourth opening hole 2000, referring to FIG. 19, a photoresist layer (not shown) is formed on the interior side of the gate insulation layer 1120. Using the shade pattern 1620 as a mask, a backside exposure process 1920 is performed to form a photoresist pattern 1910 on part of the interior side of the gate insulation layer 1120. Using the photoresist pattern 1910 as an etching mask, part of the gate insulation layer 1120 and the first insulation layer 1410 is removed to form a fourth opening hole 2000 exposing the interior surface of the first conductive layer 1420.

Thus, the present invention can use glass as the substrate in the LCD, and can use single crystal silicon having a high mobility as the channel layer in the TFT, thereby reducing cost, raising performance, and ameliorating the disadvantages of the prior art.

Finally, while the invention has been described by way of example and in terms of the above preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a thin film transistor on a transparent plate, comprising the steps of:

(a) providing a semiconductor layer having an active area;
(b) forming a gate insulation layer on the semiconductor layer;
(c) forming a shielding layer on part of the gate insulation layer, wherein the width of the shielding layer is wider than the width of the active area;
(d) performing a first ion implantation to form a shallower doped region in the semiconductor layer;
(e) removing the shielding layer;
(f) performing a second ion implantation with the shielding layer as a mask, to form a deeper doped region in part of the semiconductor layer;
(g) forming a gate layer on part of the gate insulation layer;
(h) forming a source region and a drain region in the semiconductor layer located at both sides of the gate layer;
(i) forming a first insulation layer on the gate layer and the gate insulation layer;
(j) forming a first conductive layer on part of the first insulation layer;
(k) forming a second insulation layer on the first conductive layer and the first insulation layer;
(l) removing part of the second insulation layer, the first insulation layer and the gate insulation layer to form a first opening hole, a second opening hole and a third opening hole, wherein the first opening hole, exposes part of the surface of the source region, the second opening hole exposes part of the surface of the drain region and the third opening hole exposes part of the surface of the first conductive layer;
(m) filling a conductive material in the first opening hole, the second opening hole and the third opening hole to form a first plug, a second plug and a third plug;
(n) forming a second conductive layer and a third conductive layer on part of the second insulation layer, wherein the second conductive layer electrically connects the first plug and the third conductive layer electrically connects the second plug and the third plug;
(o) forming a third insulation layer on the second conductive layer, the third conductive layer and the second insulation layer;
(p) forming a shade pattern on part of the third insulation layer, wherein the shade pattern is not over the first conductive layer or is over part of the first conductive layer;
(q) forming a silicon oxide layer on the shade pattern and the third insulation layer;
(r) forming a transparent plate on the silicon oxide layer;
(s) performing an annealing process to peel the semiconductor layer from the deeper doped region and the shallower doped region, to form a semiconductor thin film adhered to the gate insulation layer;
(t) removing part of the semiconductor thin film to expose part of the gate insulation layer, and to leave a remaining semiconductor thin film adhered to the gate insulation layer located at the active area; and
(u) removing part of the gate oxide layer and part of the first insulation layer to form a fourth opening hole, wherein the fourth opening hole exposes the first conductive layer.

2. The method according to claim 1, wherein the semiconductor layer is a single crystal silicon layer.

3. The method according to claim 1, wherein the gate insulation layer is a $SiO_2$ layer.

4. The method according to claim 1, wherein the shielding layer is a photoresist layer, a metal layer or a SiN layer.

5. The method according to claim 1, wherein the first ion implantation is a hydrogen ion implantation or a nitrogen ion implantation.

6. The method according to claim 1, wherein the depth of the shallower region is about 500~2000 angstrom.

7. The method according to claim 1, wherein the second ion implantation is a hydrogen ion implantation or a nitrogen ion implantation.

8. The method according to claim 1, wherein the depth of the deeper region is about 1000~12000 angstrom.

9. The method according to claim 1, wherein the gate layer is a polysilicon layer or a metal layer.

10. The method according to claim 1, wherein the step (h) comprises the step of:
performing a third ion implantation to form the source region and the drain region in the semiconductor layer.

11. The method according to claim 10, wherein the third ion implantation is an n type ion implantation or a p type ion implantation.

12. The method according to claim 1, wherein the first insulation layer is a $SiO_2$ layer.

13. The method according to claim 1, wherein the first conductive layer is an ITO (indium tin oxide) layer or an IZO (indium zinc oxide) layer.

14. The method according to claim 1, wherein the second insulation layer is a $SiO_2$ layer.

15. The method according to claim 1, wherein the conductive material is tungsten (W), titanium (Ti) or aluminum (Al).

16. The method according to claim 1, wherein the second conductive layer is a molybdenum (Mo) layer, a tungsten layer, an aluminum layer or an aluminum alloy layer.

17. The method according to claim 1, wherein the third conductive layer is a molybdenum (Mo) layer, a tungsten layer, an aluminum layer or an aluminum alloy layer.

18. The method according to claim 1, wherein the third insulation layer is a $SiO_2$ layer.

19. The method according to claim 1, wherein the shade pattern is an opaque material.

20. The method according to claim 19, wherein the opaque material is chromium (Cr).

21. The method according to claim 1, wherein the step (r) comprises the step of:
performing an anode bonding process to connect the transparent plate to the silicon oxide layer.

22. The method according to claim 1, wherein the transparent plate is a glass plate or a quartz plate.

23. The method according to claim 1, wherein the temperature of the annealing process is about 200~600° C.

24. The method according to claim 1, further comprising, after the step (t), the step of:
smoothing the surface of the remaining semiconductor layer.

25. The method according to claim 1, wherein the step (u) comprises the steps of:
(u1) forming a photoresist layer on the interior side of the gate insulation layer;
(u2) performing a backside exposure process with the shade pattern as a mask to form a photoresist pattern on part of the interior side of the gate insulation layer; and
(u3) removing part of the gate insulation layer and the first insulation layer with the photoresist pattern as a mask, to form a fourth opening hole exposing the interior surface of the first conductive layer.

* * * * *